(12) United States Patent
Suzuki et al.

(10) Patent No.: US 9,170,276 B2
(45) Date of Patent: Oct. 27, 2015

(54) COAXIAL CABLE MEMBER COUPLED TO A SIGNAL TERMINAL, A GROUND TERMINAL AND AN AUXILIARY GROUND CONDUCTOR WITH AN ELASTICALLY-DEFORMABLE PIECE

(75) Inventors: Teruhito Suzuki, Kanagawa (JP); Shin Sakiyama, Tokyo (JP)

(73) Assignees: Molex Japan Co., Ltd., Yamato (JP); Advantest Corporation, Tokyo (JP)

( * ) Notice: Subject to any disclaimer, the term of this patent is extended or adjusted under 35 U.S.C. 154(b) by 209 days.

(21) Appl. No.: 13/548,328

(22) Filed: Jul. 13, 2012

(65) Prior Publication Data

US 2013/0015873 A1    Jan. 17, 2013

(30) Foreign Application Priority Data

Jul. 14, 2011    (JP) .................................. 2011-155964

(51) Int. Cl.
| | |
|---|---|
| *H01R 9/05* | (2006.01) |
| *G01R 1/04* | (2006.01) |
| *H01R 12/72* | (2011.01) |
| *H01R 13/6471* | (2011.01) |
| *H01R 24/52* | (2011.01) |
| *G01R 31/28* | (2006.01) |

(52) U.S. Cl.
CPC ............... *G01R 1/0416* (2013.01); *H01R 9/05* (2013.01); *H01R 12/721* (2013.01); *H01R 13/6471* (2013.01); *G01R 31/2889* (2013.01); *H01R 24/52* (2013.01); *H01R 2201/20* (2013.01)

(58) Field of Classification Search
USPC .......................................... 439/578–585, 108
See application file for complete search history.

(56) References Cited

U.S. PATENT DOCUMENTS

| | | | |
|---|---|---|---|
| 6,250,953 B1 | 6/2001 | Niitsu | |
| 6,809,265 B1* | 10/2004 | Gladd et al. ................ | 174/74 R |
| 7,780,474 B2 | 8/2010 | Ito | |
| 7,909,646 B2* | 3/2011 | Feldman et al. ............. | 439/579 |
| 2004/0206542 A1* | 10/2004 | Gladd et al. .................... | 174/78 |
| 2012/0094534 A1* | 4/2012 | Motohashi et al. ........... | 439/585 |

FOREIGN PATENT DOCUMENTS

| | | |
|---|---|---|
| JP | 2001-077608 A | 3/2001 |
| JP | 2008-226736 | 9/2008 |
| JP | 2011-014324 A | 1/2011 |
| JP | 2011-014328 A | 1/2011 |
| WO | WO 2010/042579 A2 | 4/2010 |

OTHER PUBLICATIONS

U.S. Appl. No. 2012/135,642, filed May 31, 2012, Chang.

* cited by examiner

*Primary Examiner* — Chandrika Prasad

(57) ABSTRACT

In a cable assembly, when auxiliary ground conductor is provided so as to face the lower surface of supporting insulating member, elastically-deformed piece in an elastically deformed status comes in contact with the tip of ground terminal protruding from the lower surface of supporting insulating member.

20 Claims, 17 Drawing Sheets

COAXIAL CABLE MEMBER COUPLED TO A SIGNAL TERMINAL, A GROUND TERMINAL AND AN AUXILIARY GROUND CONDUCTOR WITH AN ELASTICALLY-DEFORMABLE PIECE

REFERENCE TO RELATED APPLICATIONS

The Present Disclosure claims priority to prior-filed Japanese Patent Application No. 2011-155964, entitled "Cable Assembly, Connector And Semiconductor Tester," filed on 14 Jul. 2011 with the Japanese Patent Office. The content of the aforementioned Patent Application is incorporated in its entirety herein.

BACKGROUND OF THE PRESENT DISCLOSURE

The Present Disclosure relates, generally, to a cable assembly, connector and semiconductor tester, and, more particularly, to technology that improves signal transmission properties.

A connector into which a co-axial cable is inserted and which electrically connects the co-axial cable and an electronic device has traditionally been known. For such cables, a co-axial structure in which a ground conductor surrounds a signal conductor has been utilized, in which the ground conductor blocks electromagnetic waves. An example is disclosed in Japanese Patent Application No. 2007-065754, the content of which is also incorporated herein in its entirety.

Incidentally, on the tip of the co-axial cable, a signal terminal and a ground terminal, utilized to connect to a signal terminal and a ground terminal so that the co-axial cable is connected to the terminals of the other side, are provided. On the tip, the ground terminal preferably takes a co-axial constitution surrounding the signal terminal.

However, due to a demand to improve the density of terminals, it is sometimes difficult to utilize a co-axial structure in which the ground terminal surrounds the signal terminal. Because of this, the signal transmission properties might be deteriorated.

SUMMARY OF THE PRESENT DISCLOSURE

The Present Disclosure was developed in consideration of the above-stated situation. A purpose thereof is to provide a cable assembly, connector and semiconductor tester, capable of improving the density of terminals and preventing signal transmission properties from degrading.

According to the Present Disclosure, the signal terminal and the ground terminal, extending in the direction in which the tip of the co-axial cable is inserted, are provided in a parallel manner on the first plane of the insulating member. Thus, it becomes possible to improve the density of the terminals. Moreover, the auxiliary ground conductor is positioned on the second plane of the insulating member. Thus, it becomes possible to prevent the signal transmission properties from degradation. In particular, the ground terminal and the auxiliary ground conductor come in contact and, consequently, have the same electrical potential. Thus, the effects of preventing the signal transmission properties from degradation are enhanced.

Moreover, in an embodiment of the Present Disclosure, the second plane of the insulating member has a primary plane in contact with the auxiliary ground conductor, as well as a bottom concave extending from the primary plane, and the tip of the ground terminal protrudes from the bottom and does not extend any further than the primary plane. Thus, it becomes possible to prevent the tip of the ground terminal from damaging the auxiliary ground conductor.

Further, in an embodiment of the Present Disclosure, an insertion hole for the tip of the ground terminal to be inserted is formed on the insulating member, and the tip of the ground terminal passes through the insertion hole and protrudes from the second plane. Thus, it becomes possible to prevent the tip of the ground terminal from being displaced when the elastically-deformed piece comes in contact with the tip of the ground terminal.

Additionally, in an embodiment of the Present Disclosure, the main body has a convex member on the inside of the insertion hole, and the base of the auxiliary ground conductor rather than the tip thereof is positioned between the convex member and the insulating member. Thus, it becomes possible to prevent the elastic recovery from being widely varied by causing the range of the elastic deforming of the auxiliary ground conductor to be restricted on the tip thereof rather than on the convex member thereof.

Also, in an embodiment of the Present Disclosure, the tip of the auxiliary ground conductor furthermore has a disengagement-preventing piece bent in the opposite direction from the elastically-deformed piece. Thus, because the disengagement-preventing piece is latched with the convex member of the main body, it becomes possible to prevent the auxiliary ground conductor from being disengaged from the main body.

Finally, in an embodiment of the Present Disclosure, the auxiliary ground conductor has an arm in contact with the ground conductor of the co-axial cable on the base thereof rather than on the tip thereof. Thus, because the points of contact between the arm and the auxiliary ground conductor are increased, it becomes possible to furthermore stabilize the electrical potential of the auxiliary ground conductor. In particular, by providing points of contact both on the tip of the auxiliary ground conductor and on the tip of the base, it becomes possible to reduce branched portions such as stubs.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
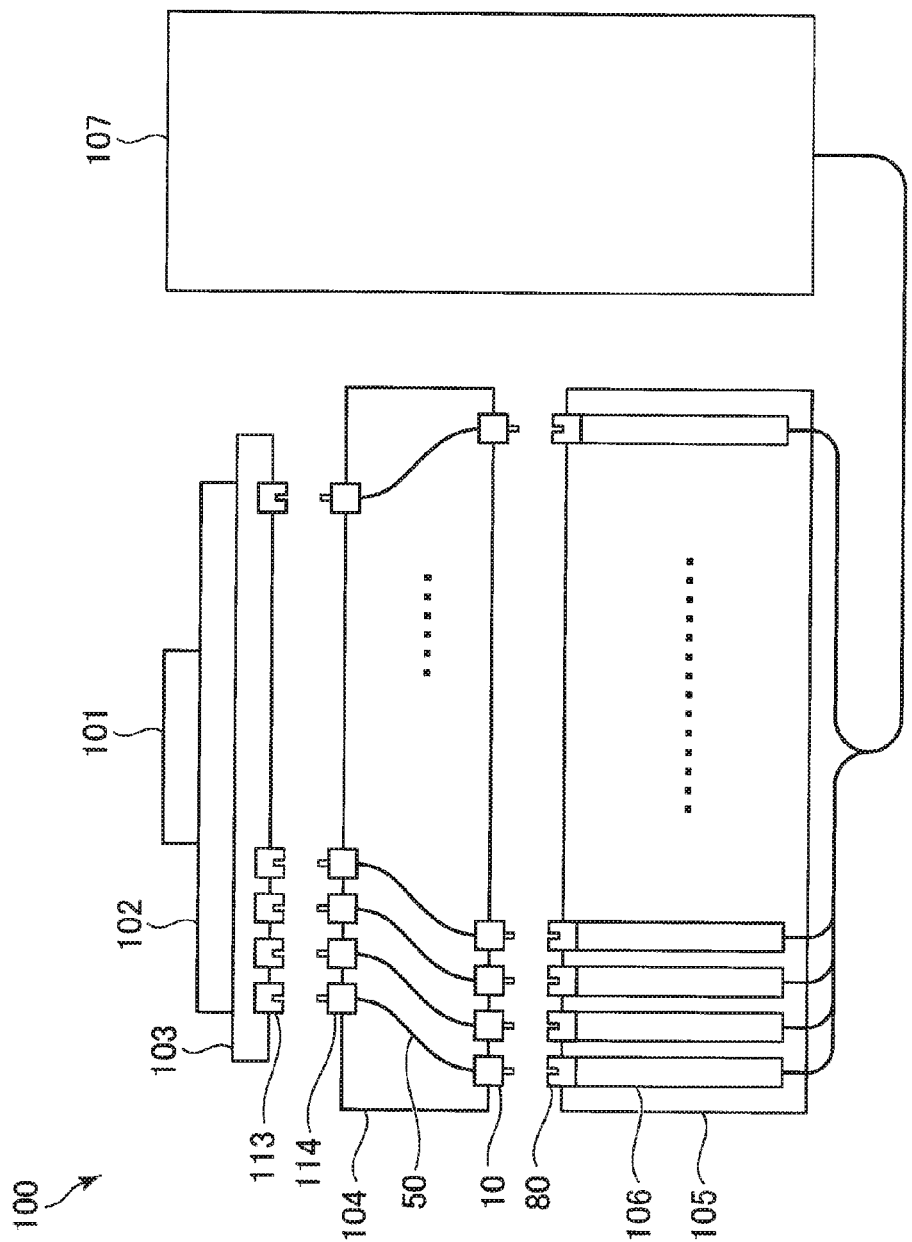
FIG. 1 is a schematic view showing a semiconductor tester of an embodiment of the Present Disclosure.

FIG. 1 is a schematic view showing semiconductor tester 100. Semiconductor tester 100 comprises test head 105; motherboard 104, positioned on test head 105; performance board 103, positioned on motherboard 104; and device socket 102, positioned on performance board 103.

Semiconductor 101, which is to be tested, is mounted on device socket 102. On the lower surface of performance board 103, multiple connectors 113 are provided. Each connector 113 is electrically connected to semiconductor 101 through device socket 102. On the upper surface of motherboard 104, a multiple number of connectors 114 are provided. Into each of connectors 114, the upper end of co-axial cable 50, which is accommodated on motherboard 104, is inserted. On the lower surface of motherboard 104, multiple connectors 10 are provided. Into each connector 10, the lower end of co-axial cable 50, which is accommodated on motherboard 104, is inserted. On the upper surface of test head 105, a multiple number of connectors 80, which engage with connectors 10, are provided. Each connector 80 is mounted on the edge of the substrate of test head 105, and connected to test module 106. Test module 106 responds to the instructions sent by tester main body 107 to send the output thereof to semiconductor 101.

Figure 2A:
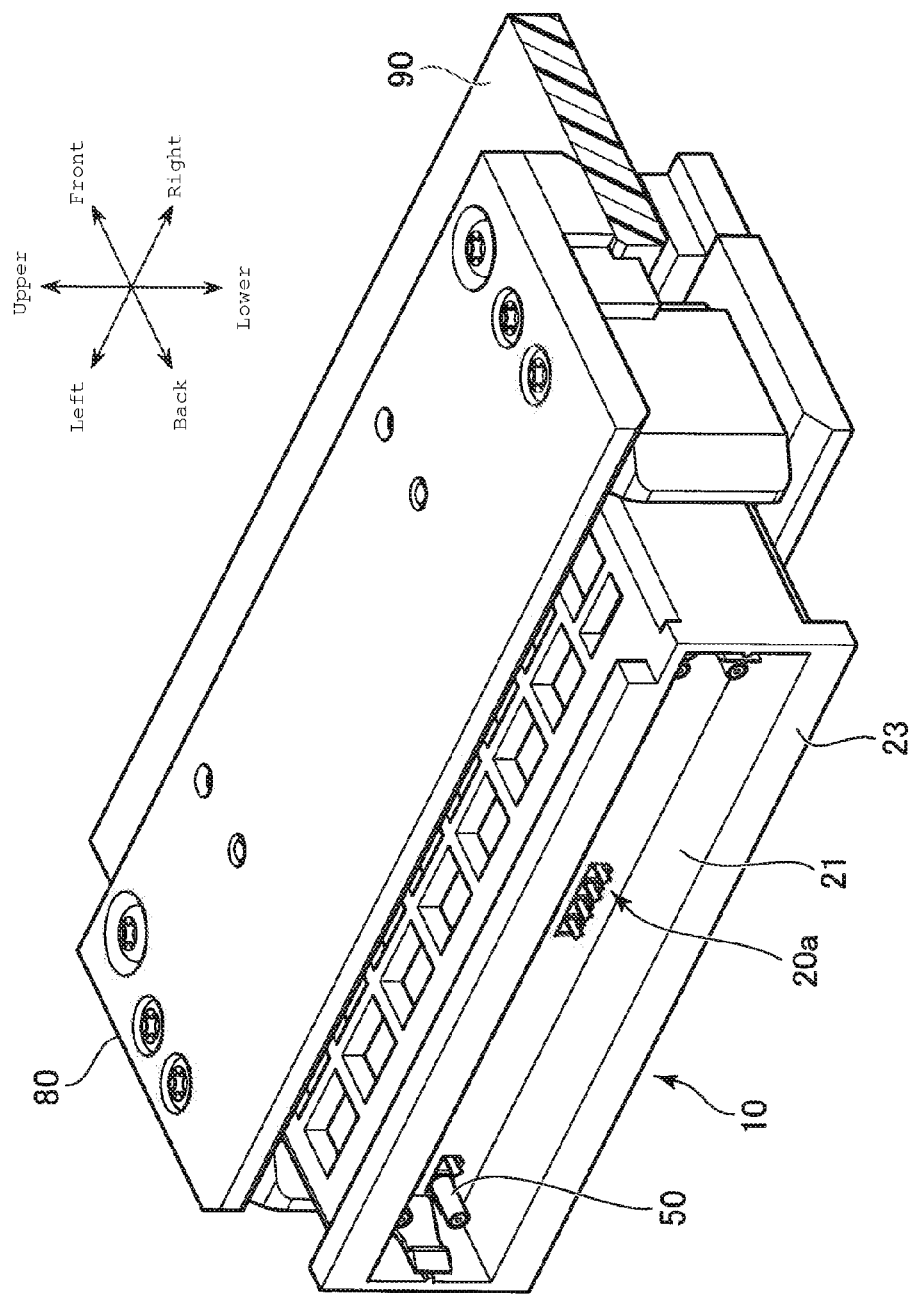
FIG. 2A is an oblique view showing a connector of an embodiment of the Present Disclosure.
Figure 2B:
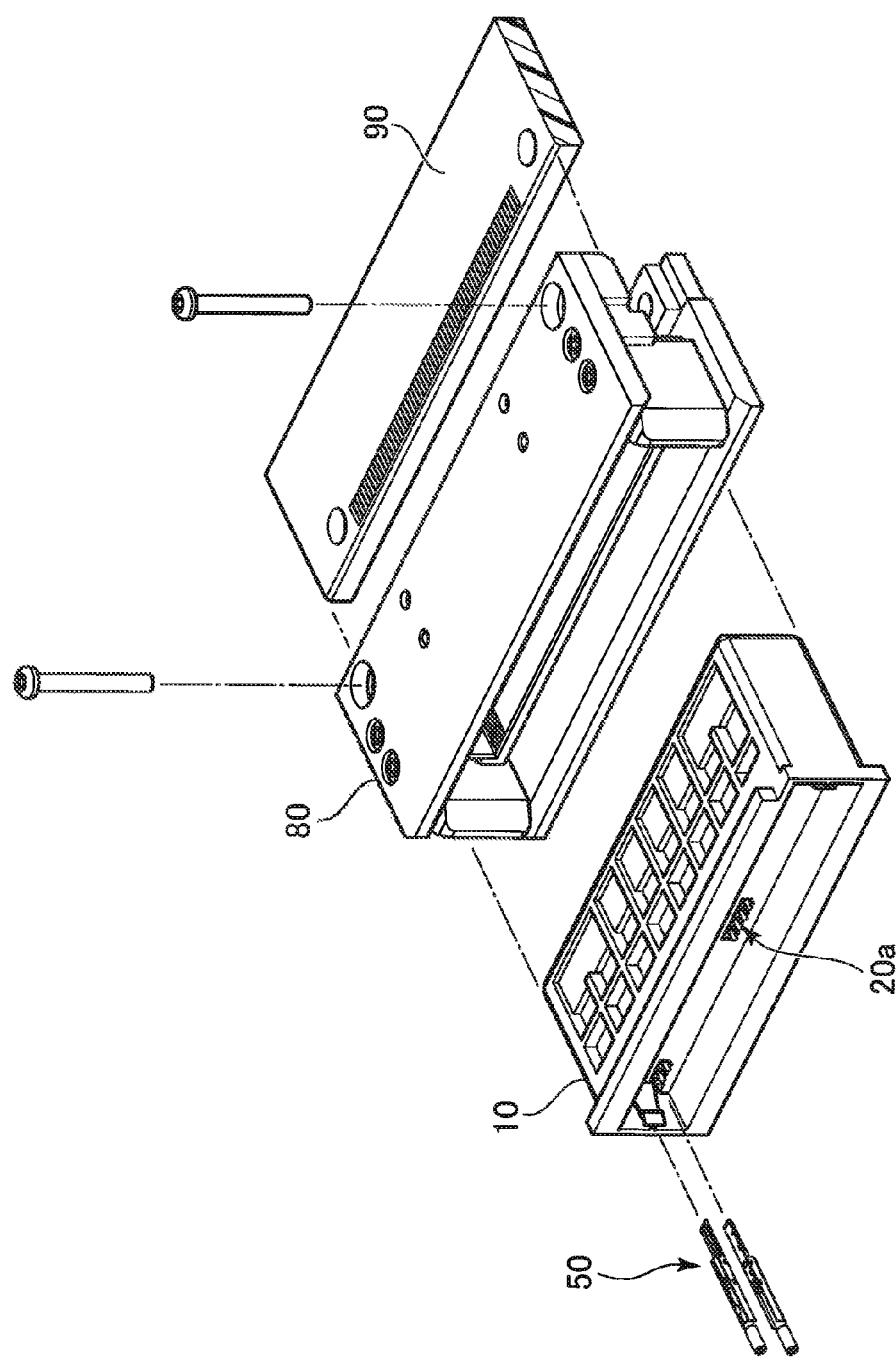
FIG. 2B is an exploded oblique view showing the connector of FIG. 2A.
Figure 3:
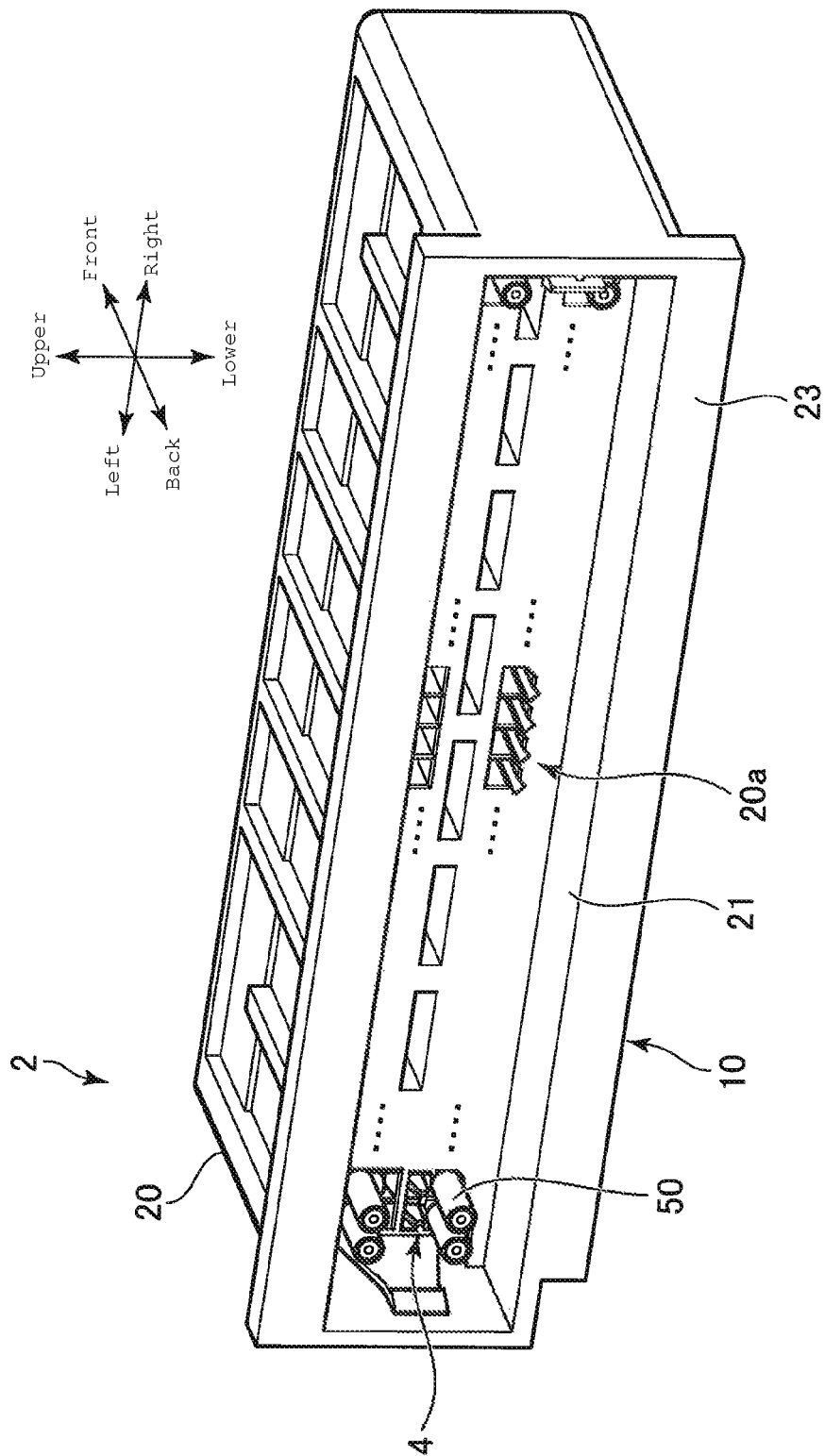
FIG. 3 is an oblique view showing the connector of FIG. 2A.
Figure 4:
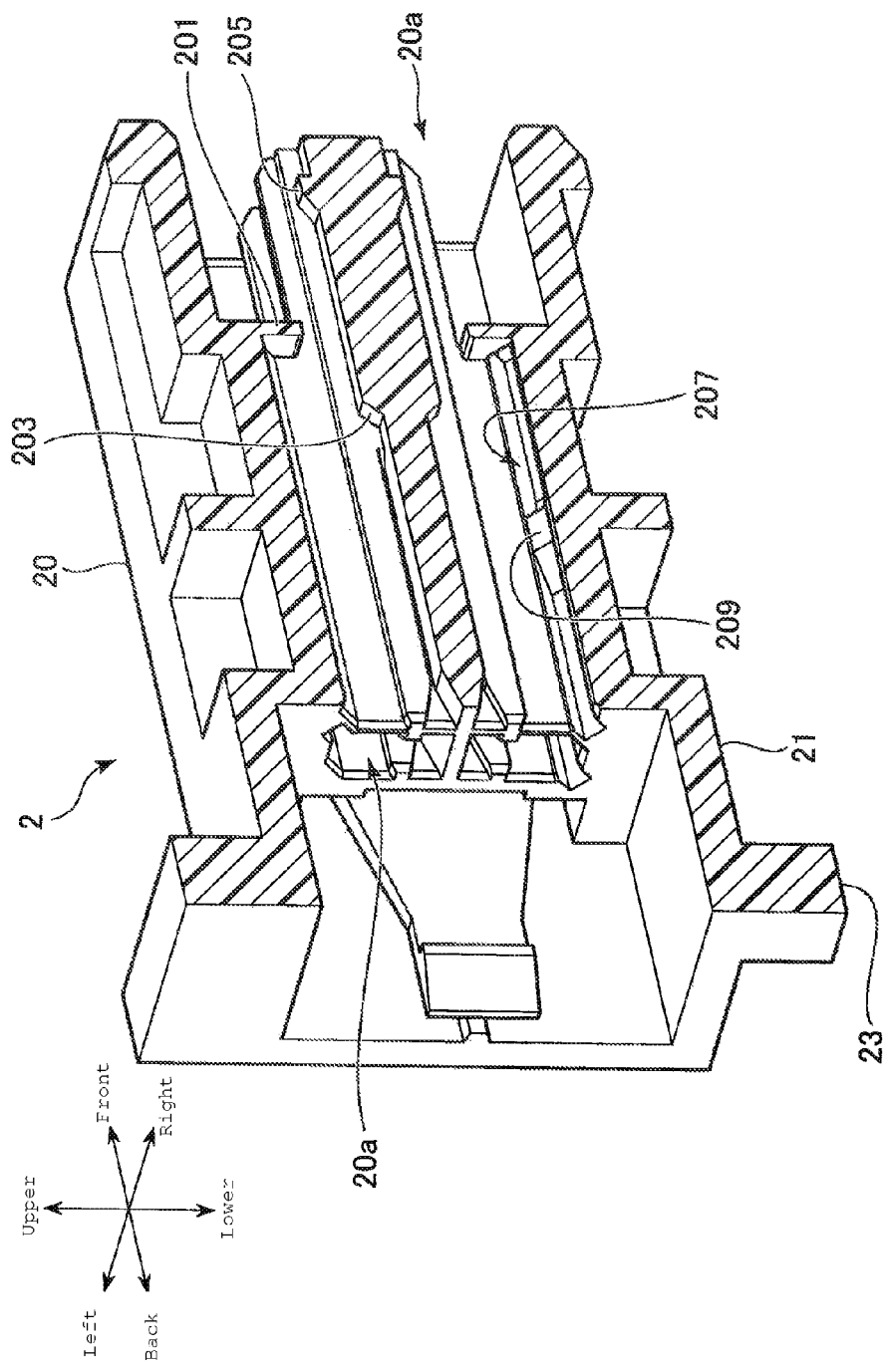
FIG. 4 is a cross-sectional view of the main body of the connector of FIG. 2A.
Figure 5A:
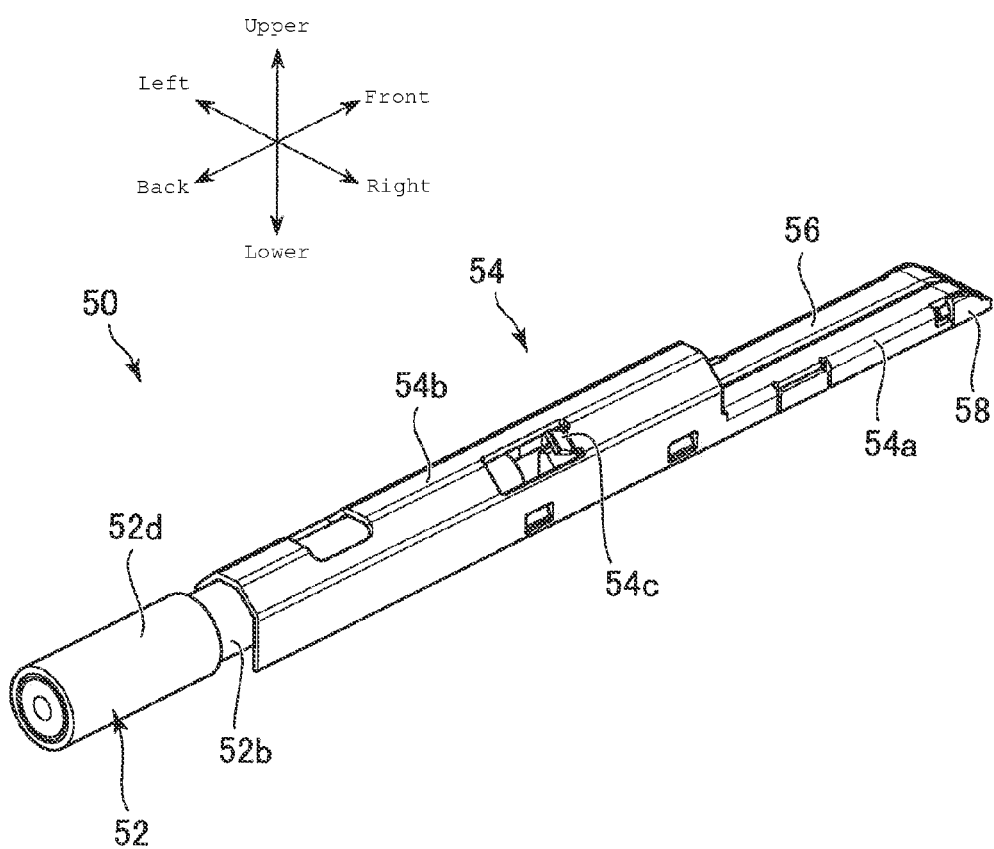
FIG. 5A is an oblique view showing the tip of a co-axial cable.
Figure 5B:
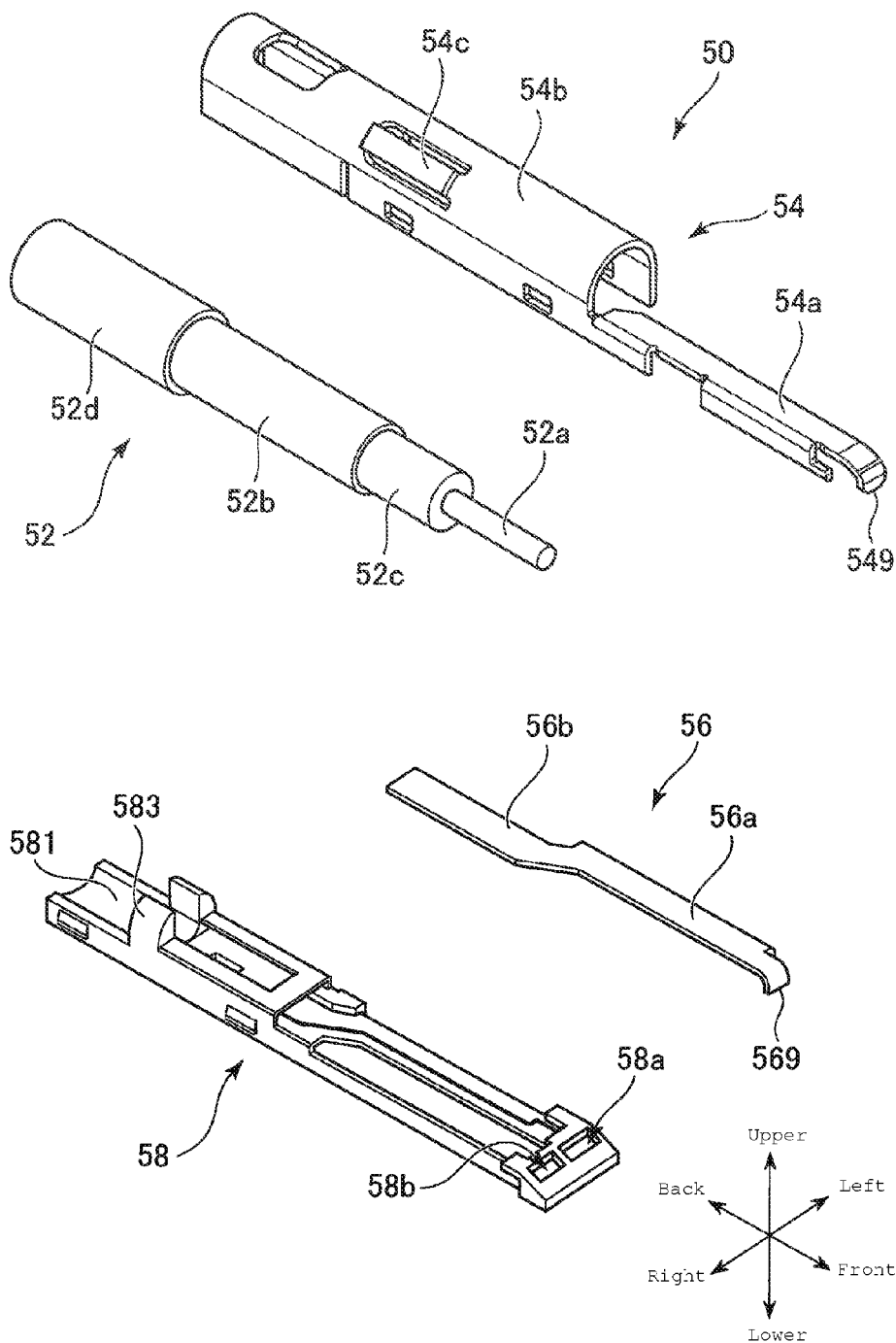
FIG. 5B is an exploded oblique view showing the tip of the co-axial cable of FIG. 5A.
Figure 5C:
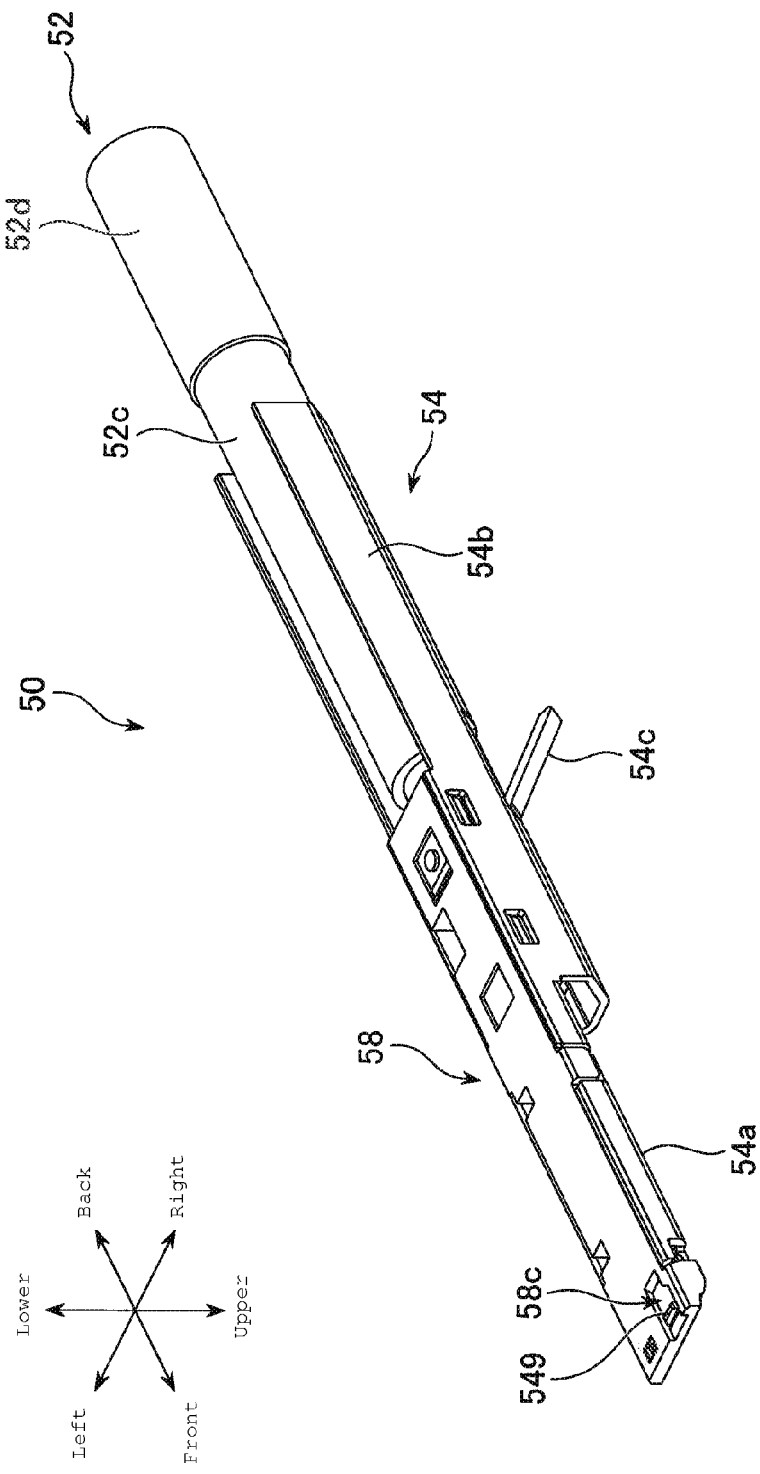
FIG. 5C is an oblique view showing the tip of the co-axial cable of FIG. 5A.
Figure 5D:
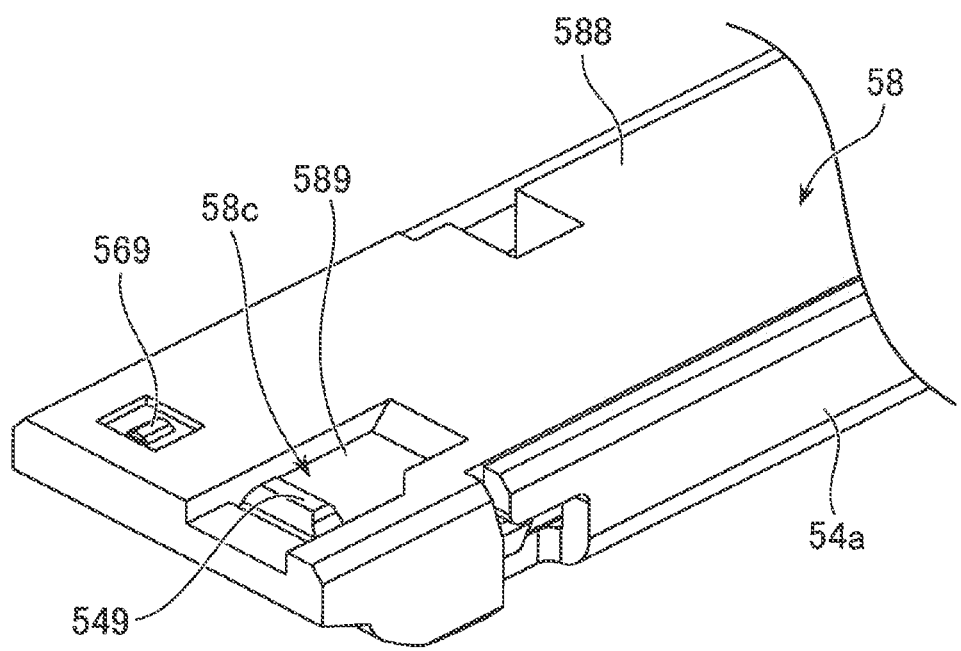
FIG. 5D is an enlarged view showing the essential part of FIG. 5C.
Figure 6A:
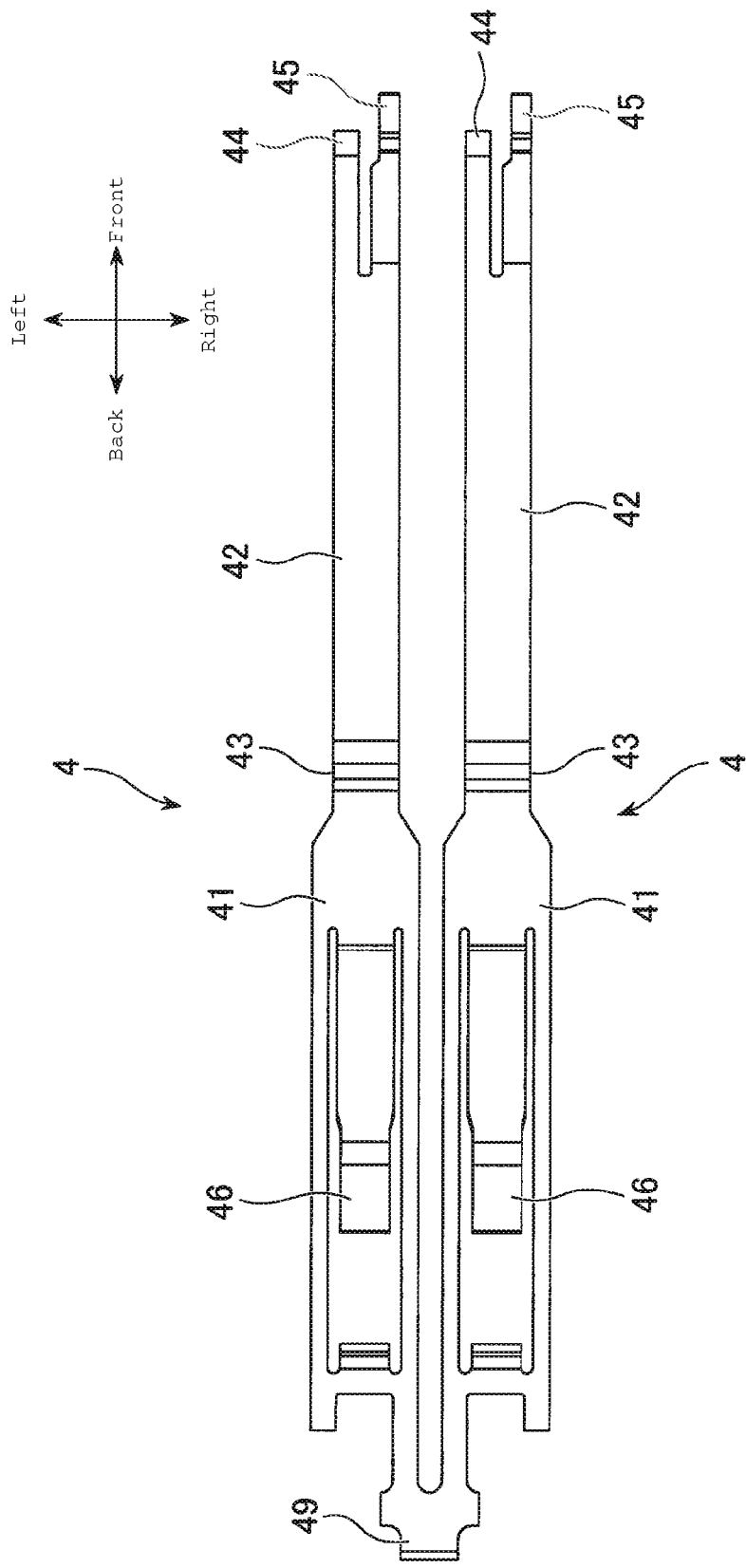
FIG. 6A is a plan view showing an auxiliary ground conductor.
Figure 6B:
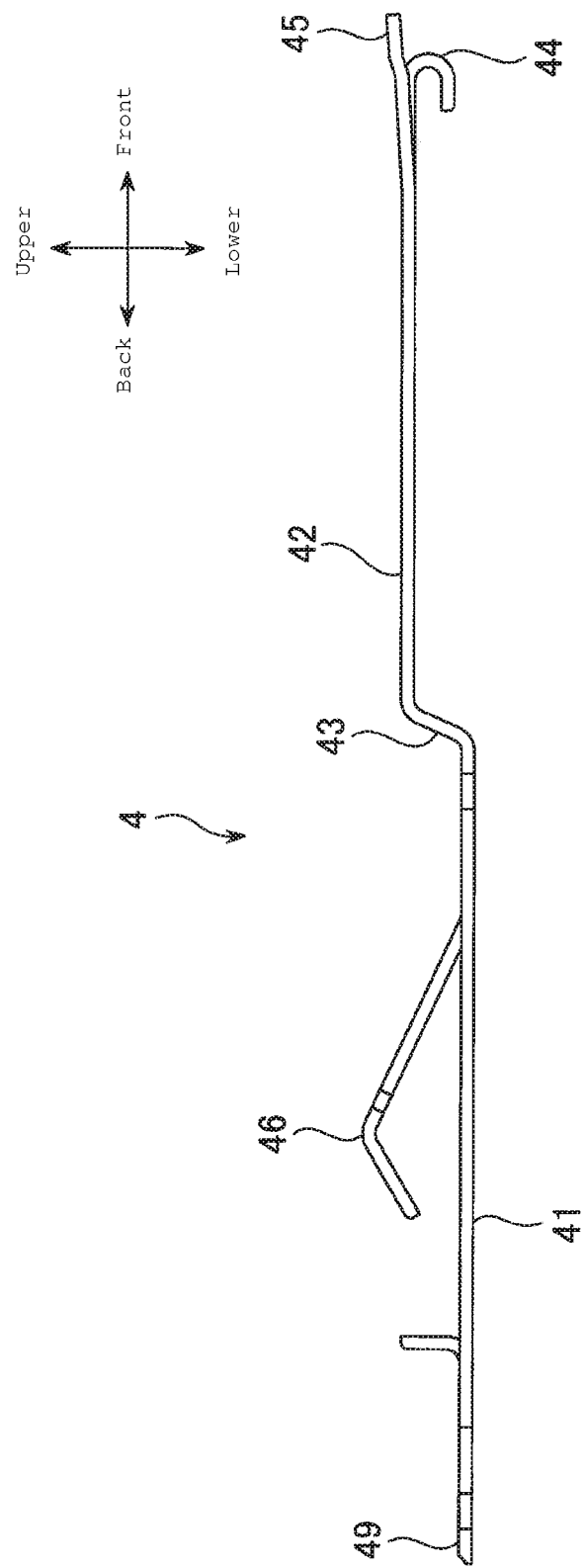
FIG. 6B is a side view showing the auxiliary ground conductor of FIG. 6A.
Figure 7A:
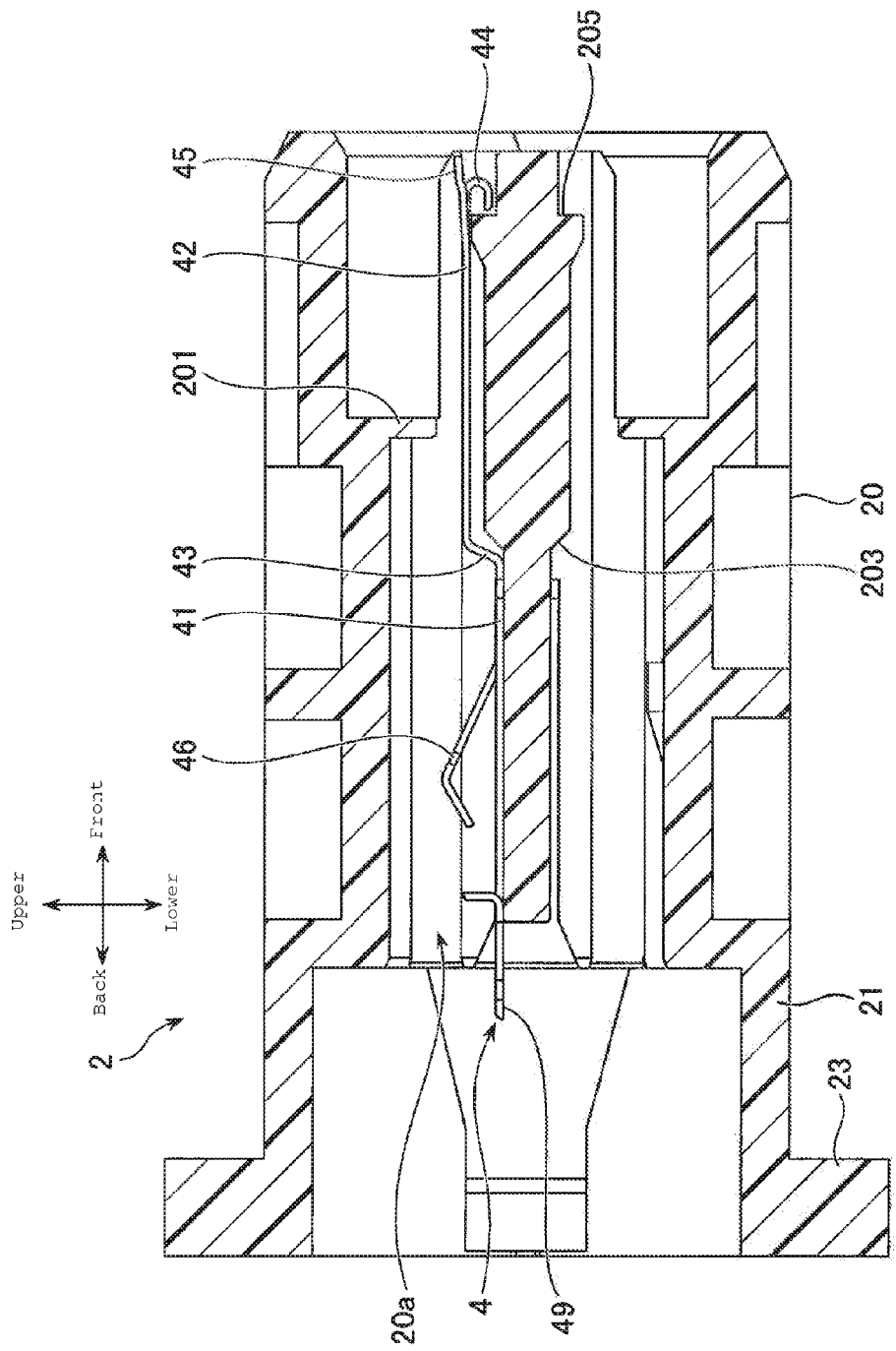
FIG. 7A is a cross-sectional view showing the status in which the auxiliary ground conductor of FIG. 6A is inserted into the main body of the connector of FIG. 2A.
Figure 7B:
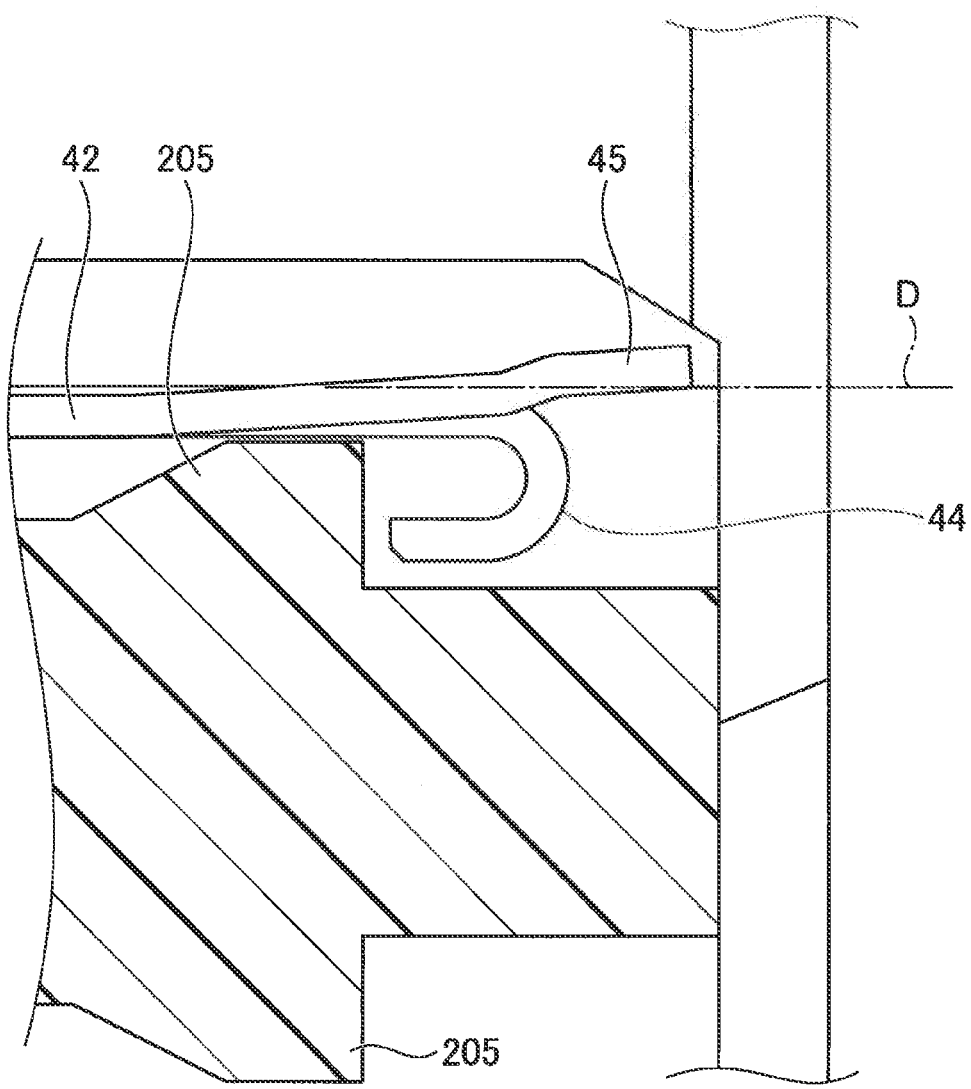
FIG. 7B is an enlarged view showing the essential part of FIG. 7A.
Figure 8A:
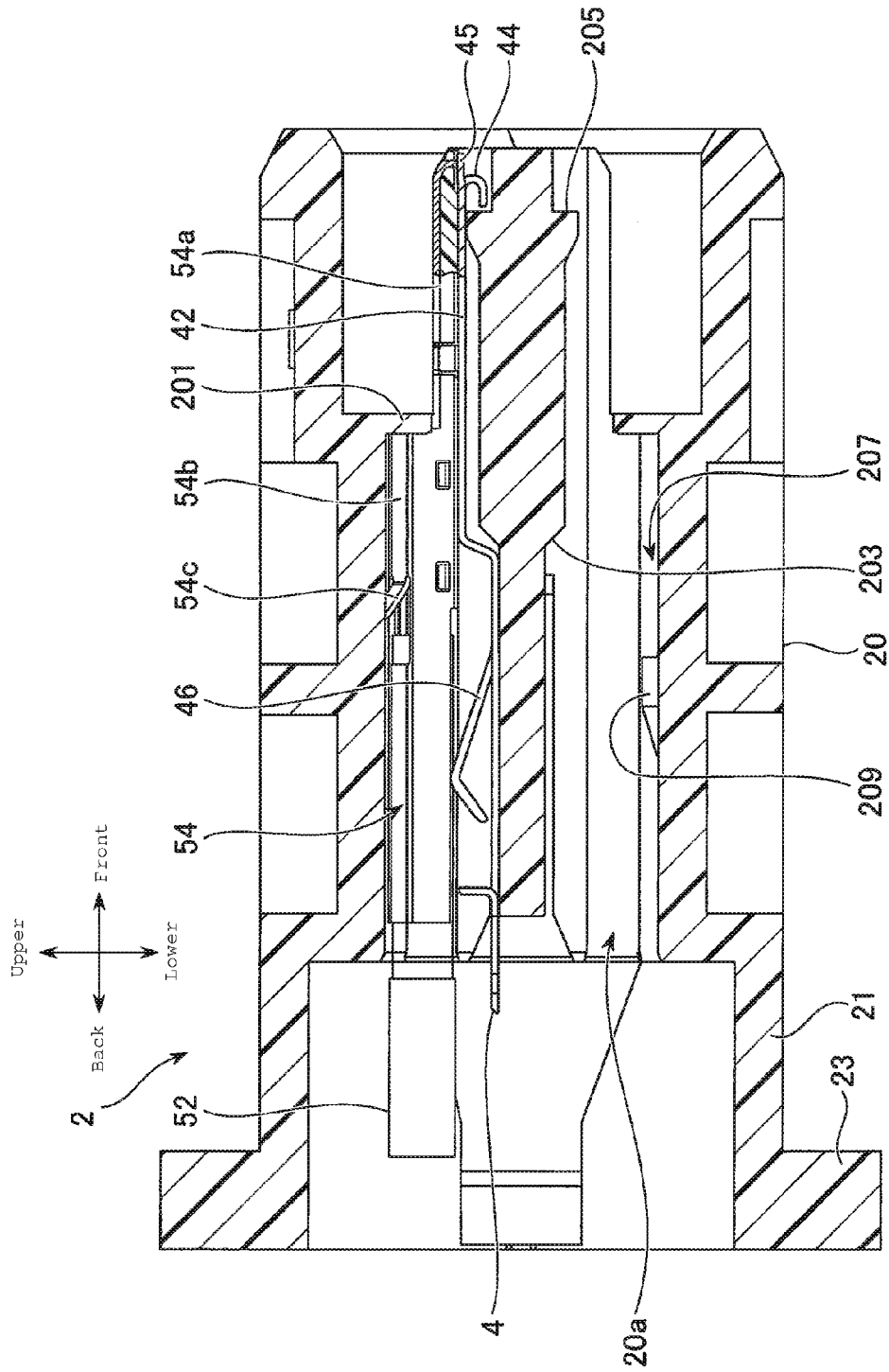
FIG. 8A is a cross-sectional view showing the status in which the tip of the co-axial cable of FIG. 5A and the auxiliary ground conductor of FIG. 6A are inserted into the main body of the connector of FIG. 2A.
Figure 8B:
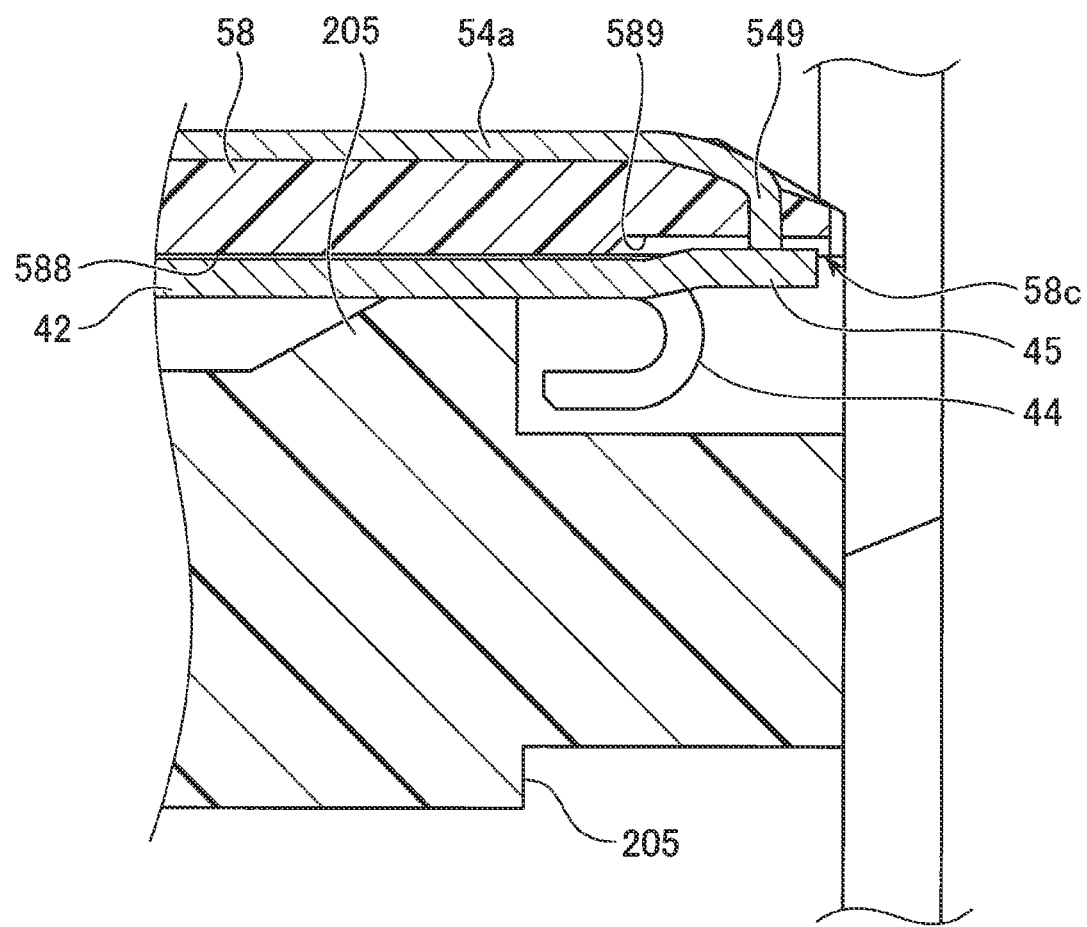
FIG. 8B is an enlarged view showing the essential part of FIG. 8A.
Figure 9A:
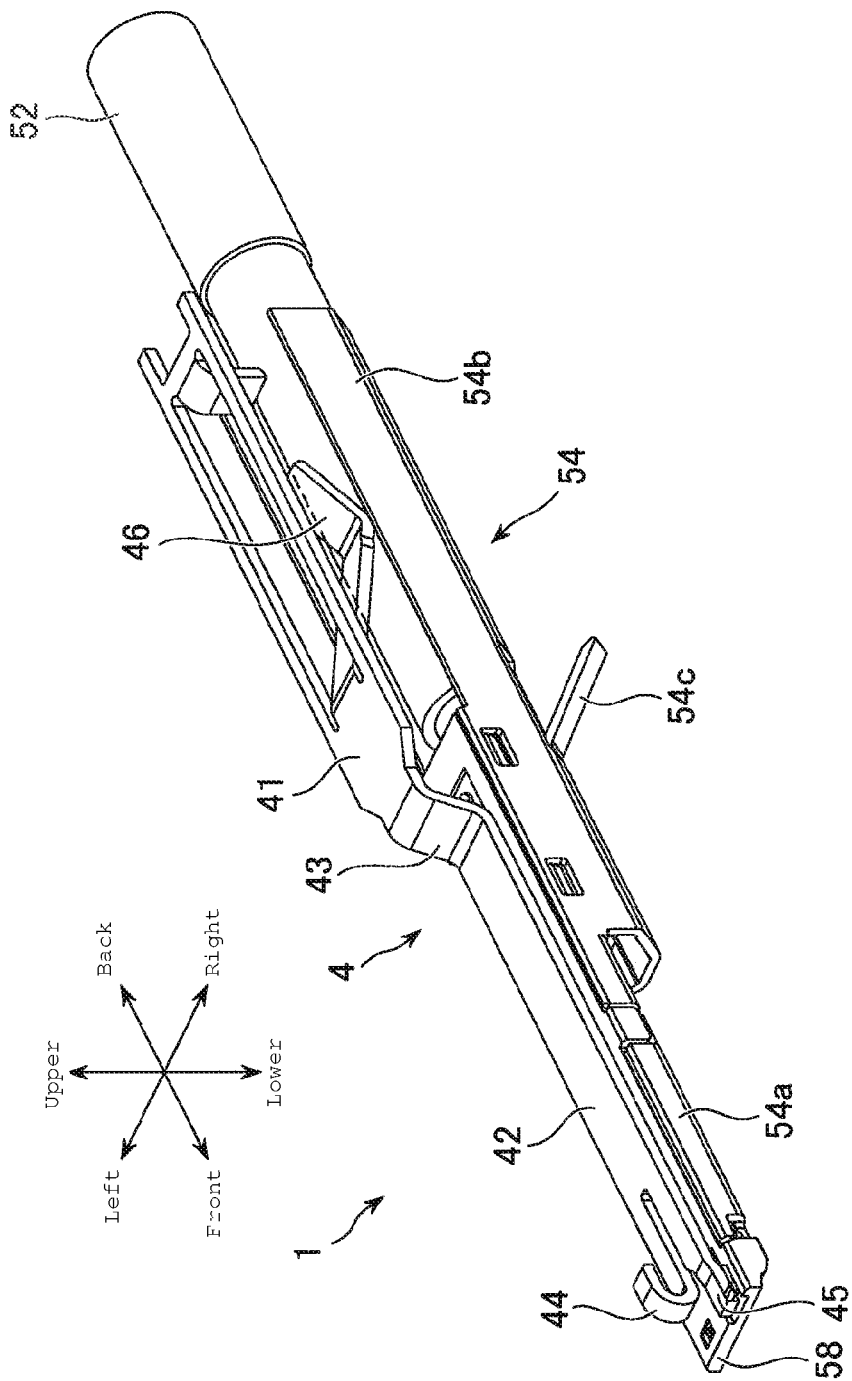
FIG. 9A is an oblique view showing a cable assembly of an embodiment of the Present Disclosure.
Figure 9B:
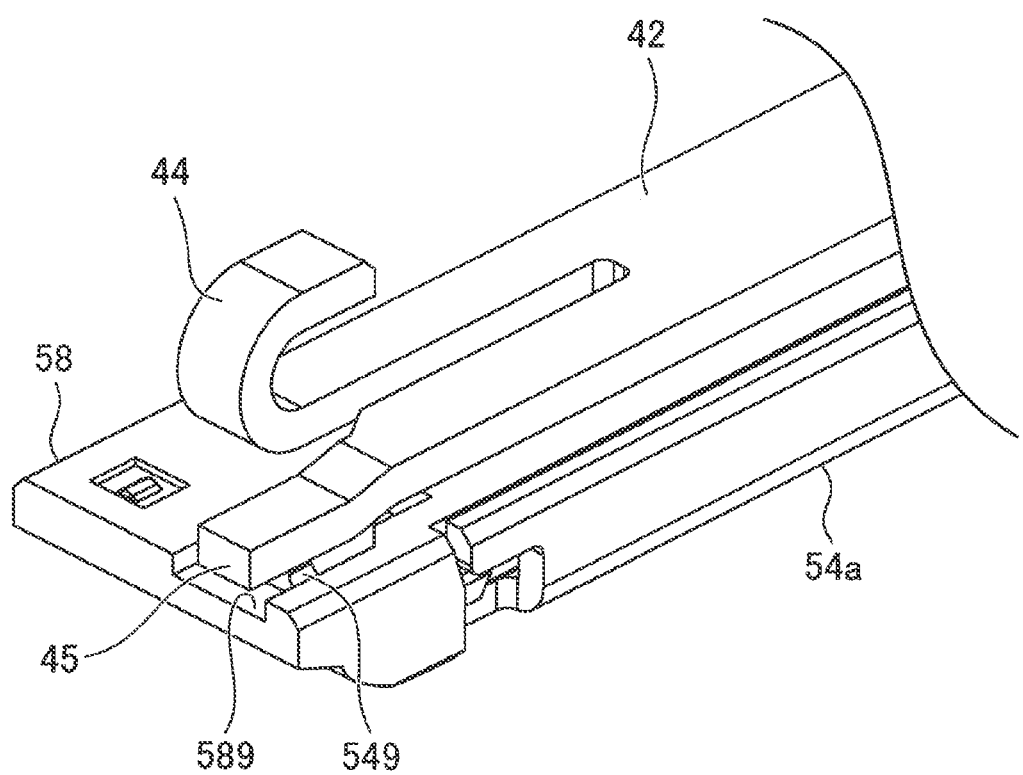
FIG. 9B is an enlarged view showing the essential part of FIG. 9A.

FIGS. 2A-B and 3 are oblique views of connector 10. In these Figures, only some of insertion holes 20a and co-axial cable 50 are shown. FIG. 4 is a cross-sectional view of main body 2. FIGS. 5A-D are oblique views showing the tip of co-axial cable 50. FIGS. 6A-B are a plan view and a side view showing auxiliary ground conductor 4. FIGS. 7A-B are cross-sectional views showing main body 2 into which auxiliary ground conductor 4 is inserted. FIGS. 8A-B are cross-sectional views showing main body 2 into which the tip of co-axial cable 50 and auxiliary ground conductor 4 are inserted. Finally, FIGS. 9A-B are oblique views showing cable assembly 1. In these Figures, the direction in which co-axial cable 50 is inserted is referred to as the front direction, and the opposite direction from the above-stated direction is referred to as the rear direction; the directions in which auxiliary ground conductor 4 is positioned relative to the tip of co-axial cable 50 are referred to as the upward direction or the downward direction.

As shown in FIGS. 2A-B, connector 10 is constituted as a male connector in an approximate box-like shape, and it is inserted into a female counterpart connector, connector 80. Onto connector 10, a multiple number of co-axial cables 50 are mounted. Moreover, counterpart connector 80 is mounted onto the edge of substrate 90. As shown in FIGS. 3-4, connector 10 comprises main body 2 in an approximate box-like shape, on which a multiple number of insertion holes 20a are formed; ground terminal 54, which is positioned on the tip of co-axial cable 50 to be inserted into insertion hole 20a; signal terminal 56 and supporting insulating member 58 (see FIGS. 5A-5D); and auxiliary ground conductor 4, which is inserted into insertion hole 20a.

Main body 2 comprises main body member 20 in an approximate box-like shape, on which multiple insertion holes 20a passing through in the front-rear direction are formed; extending member 21 of a frame-like shape, extending from the rim on the rear plane of main body member 20, and surrounding the rear plane of main body member 20; and flange member 23, spreading from the edge of extending member 21 in the vertical direction thereof. On the inside of insertion hole 20a are provided stoppers 201 and 203, positioned on the respective sides in the vertical direction; convex members 205, positioned on the edge in the front direction; groove member 207, which extends in the front-rear direction; and stopper 209, positioned midway of the above.

As shown in FIGS. 5A-D, in co-axial cable 50, on the tip of cable member 52, ground terminal 54, signal terminal 56 and supporting insulating member 58 are mounted. Cable member 52 comprises signal conductor 52a; cylinder-like ground conductor 52b, surrounding signal conductor 52a; dielectric member 52c, located between signal conductor 52a and ground conductor 52b; and outer case 52d, covering ground conductor 52b. On the tip of cable member 52, ground conductor 52b, dielectric member 52c and signal conductor 52a are exposed in this order towards the front direction. Supporting insulating member 58, constituted with an insulating material, is formed into an approximate plate-like shape extending in the front-rear direction with an upper surface and a lower surface, and mounted onto dielectric member 52c of cable member 52. Behind supporting insulating member 58 are provided dented member 581, concave in a circumferential manner, as well as a pair of sandwiching members 583, protruding in an upward direction. Dielectric member 52c of cable member 52 is adhered to dented member 581, and signal conductor 52a of cable member 52 is sandwiched by a pair of sandwiching members 583. On the edge of supporting insulating member 58 in the front direction, two insertion holes 58a and 58b, which pass through in the vertical direction, are formed horizontally in a parallel manner.

On the lower right-hand side on the lower surface in the front direction of supporting insulating member 58, concave member 58c is formed. In other words, the lower surface of supporting insulating member 58 contains primary surface 588 as well as bottom 589, concave relative to primary surface 588. Concave member 58c is continuous with insertion hole 58b, and an opening of insertion hole 58b is formed on bottom 589. Concave member 58c is open not only in the downward direction, but also in the forward direction.

Signal terminal 56 is constituted with a conductive metal material, is formed into an approximate plate-like shape extending in the front-rear direction, and is positioned on the upper surface of supporting insulating member 58. Signal terminal 56 comprises rear member 56b, which is welded to signal conductor 52a of cable member 52, and front member 56a, which is shifted in the left direction relative to rear member 56b. Edge 569 positioned in the front direction of signal terminal 56 is bent in the downward direction, and inserted into insertion hole 58a of supporting insulating member 58. Moreover, signal terminal 56 and supporting insulating member 58 may be formed in an integrated manner through the over-molding method, or alternatively these members may be separately formed first and then assembled.

Ground terminal 54 is constituted with a conductive material, mounted onto supporting insulating member 58, and welded to ground conductor 52b of cable member 52. Ground terminal 54 comprises half-cylinder member 54b, the axial center of which faces the front-rear direction; and extending member 54a, which extends from the right-hand side of half-cylinder member 54b in the front direction. On half-cylinder member 54b, cut-out/bent piece 54c utilized as the disengagement-preventing piece is provided. Moreover, FIG. 5A shows an example in which half-cylinder member 54b is formed into a half-octagonal-cylinder-like shape, and FIG. 5B shows an example in which half-cylinder member 54b is formed into a half-cylinder-like shape.

Supporting insulating member 58 is inserted into the inside of half-cylinder member 54b for engagement, which, together, form a cylinder. Within the space formed by supporting insulating member 58 and half-cylinder member 54b, the tip of cable member 52 is positioned. Ground conductor 52b of cable member 52 is welded to half-cylinder member 54b. Half-cylinder member 54b covers at least one half of the circumference of signal conductor 52a of cable member 52 as well as rear member 56b of signal terminal 56.

Extending member 54a is formed into an approximate plate-like shape that extends in the front-rear direction, and a part of it is bent into an L character shape when seen in a cross-sectional view. Extending member 54a is positioned on the upper surface of supporting insulating member 58 in a parallel manner with front member 56a of signal terminal 56 in the horizontal direction. Edge 549 in the front direction of extending member 54a is bent in the downward direction, and inserted into insertion hole 58b of supporting insulating member 58.

Edge 549 in the front direction of extending member 54a passes through insertion hole 58b, and protrudes from bottom 589 of supporting insulating member 58 so as not to extend any further than primary plane 588. In other words, edge 549 protrudes from bottom 589 in the downward direction so as to be accommodated within the range that is downward relative to bottom 589 and upward relative to primary plane 588, and it does not protrude any further than primary plane 588 in the downward direction.

As shown in FIGS. 6A-B, auxiliary ground conductor 4 is constituted with a conductive material, and formed by punching out a metal plate and then bending it. Auxiliary ground conductor 4 extends in the front-rear direction with a length approximately the same as that of the ground terminal 54. Auxiliary ground conductor 4 comprises front member 42, which is shifted in the upward direction relative to rear member 41, and step 43, which is provided between rear member 41 and front member 42. On rear member 41, arm 46, which takes an approximate L character shape and which can be elastically deformed in the downward direction, is provided. On the edge in the front direction of front member 42, elastically-deformable 45, elastically deformable in the downward direction, and hook 44, bent in the downward direction, are provided in a parallel manner in the horizontal direction.

Regarding the assembly of connector 10, FIGS. 7A-B are cross-sectional views showing the status in which auxiliary ground conductor 4 is inserted into insertion hole 20a of main body 2. FIGS. 8A-B are cross-sectional views showing the status in which the tip of co-axial cable 50 is furthermore inserted into insertion hole 20a of main body 2. As shown in FIGS. 7A-B, auxiliary ground conductor 4 is first inserted into insertion hole 20a of main body 2. Auxiliary ground conductor 4 is positioned on the inside (shown as the lower side in the Figures) in the vertical direction within insertion hole 20a of main body 2. Auxiliary ground conductor 4 is positioned in a manner so that rear member 41 is positioned in the rear direction relative to stopper 203, and front member 42 is positioned in the front direction relative to stopper 203. The forward shift of auxiliary ground conductor 4 is regulated by step 43 coming in contact with stopper 203.

Moreover, elastically-deformable 45 and hook 44, provided on the edge of front member 43 in the front direction, are positioned in the forward direction relative to convex member 205. The shift of auxiliary ground conductor 4 in the backward direction is regulated by hook 44 becoming latched with convex member 205. Moreover, elastically-deformable 45 is positioned on the outside in the vertical direction relative to position D at which primary plane 588 of supporting insulating member 58 (see FIG. 5D, shown as the upper side) is positioned.

The insertion of auxiliary ground conductors 4 is conducted in a status in which a multiple number of auxiliary ground conductors 4 are linked by standardizing member 49, which is provided on the edge thereof in the rear direction (see FIG. 6A). Standardizing member 49 may be broken off after auxiliary ground conductors 4 are inserted, but does not have to be broken off in order to standardize the electrical potential of auxiliary ground conductors 4.

As shown in FIGS. 8A-B, the tip of co-axial cable 50 is inserted into insertion hole 20a of main body 2, after auxiliary ground conductors 4 are inserted. The tip of co-axial cable 50 is positioned inside of insertion hole 20a so that supporting insulating member 58 faces auxiliary ground conductors 4. The shift of the tip of co-axial cable 50 in the forward direction is regulated by the front edge of half-cylinder member 54b of ground terminal 54 hitting against stopper 201. Cut-out/bent piece 54c, provided on half-cylinder member 54b of ground terminal 54, is inserted into groove 207, formed on the inside of insertion hole 20a, and positioned in the forward direction relative to stopper 209. The shift of the tip of co-axial cable 50 in the backward direction is regulated by cut-out/bent piece 54c hitting against stopper 209.

When the tip of co-axial cable 50 is inserted into insertion hole 20a of main body 2, arm 46, provided on rear member 41 of auxiliary ground conductor 4, is elastically deformed in the downward direction, which generates contact pressure. Specifically, arm 46 comes in contact with ground conductor 52b of cable member 52 (see FIGS. 5B-C). Due to the above, ground conductor 52b of cable member 52, ground terminal 54 and auxiliary ground conductor 4 are electrically connected, and the electrical potential of these members is rendered at the same level.

Moreover, when the tip of co-axial cable 50 is inserted into insertion hole 20a of main body 2, primary surface 588 of supporting insulating member 58 (see FIGS. 5C-D) comes in sliding contact with front member 42 of auxiliary ground conductors 4. Subsequently, when the tip of co-axial cable 50 reaches the depth of insertion hole 20a, elastically-deformable 45, provided on front member 42 of auxiliary ground conductors 4, is pressed down by bottom 589 of concave member 58c of supporting insulating member 58 as well as edge 549 of extending member 54a of ground terminal 54, protruding from bottom 589. Consequently, elastically-deformable 45 is elastically deformed downward. As stated above, when elastically-deformable 45 in the elastically deformed status comes in contact with edge 549 of extending member 54a, contact pressure is generated between these members. This also makes ground conductor 52b of cable member 52, ground terminal 54 and auxiliary ground conductor 4 electrically connected, and the electrical potential of these members is rendered at the same level. Moreover, in front member 42 of auxiliary ground conductor 4, the portion located in the rear direction relative to elastically-deformable 45 is sandwiched by supporting insulating member 58 and convex member 205. Moreover, the tip of co-axial cable 50, inserted into insertion hole 20a of main body 2, as well as auxiliary ground conductor 4, are positioned inside of insertion hole 20a (see FIGS. 9A-B). The tip of co-axial cable 50 and auxiliary ground conductor 4 together constitute cable assembly 1.

Thus, because the auxiliary ground conductors have the same electrical potential with that of ground terminal 54 and ground conductor 52b, it becomes possible to increase the effects of preventing the signal transmission properties from degradation. In particular, by causing elastically-deformable 45 and arm 46 of auxiliary ground conductor 4 to be in contact with ground terminal 54 and ground conductor 52b, it becomes possible to stabilize the electrical potential as well as to reduce branched portions such as stubs. In FIGS. 5A-9B, because the target was the tip of co-axial cable 50, inserted into insertion hole 20a provided on the upper side of main body 2, as well as auxiliary ground conductor 4, auxiliary ground conductor 4 was positioned in the downward direction relative to the tip of co-axial cable 50. However, if the tip of co-axial cable 50 is inserted into insertion hole 20a provided on the lower side of main body 2, the upper direction and the lower direction become reversed from that shown in the Figures.

While a preferred embodiment of the Present Disclosure is shown and described, it is envisioned that those skilled in the art may devise various modifications without departing from the spirit and scope of the foregoing Description and the appended Claims.

What is claimed is:

1. A cable assembly, the cable assembly comprising:
   a co-axial cable, the co-axial cable including a cable member;
   an insulating member, the insulating member being provided on a tip of the cable member, and including a upper surface and a lower surface, the upper and lower surfaces facing mutually opposite directions along the direction in which the tip of the cable member is inserted;
   a signal terminal, the signal terminal being electrically connected to a signal conductor of the co-axial cable, extending in the direction in which the tip of the cable member is inserted, and being provided on the upper surface;
   a ground terminal, the ground terminal being electrically connected to a ground conductor of the co-axial cable, extending in the direction in which the tip of the cable member is inserted, being provided in a parallel manner with the signal terminal on the upper surface the—tip of which is bent on the upper surface side toward the lower surface; and
   an auxiliary ground conductor, the auxiliary ground connector extending in the direction in which the tip of the cable member is inserted, being provided in a manner so as to face the lower surface, and including an elastically-deformed piece bent on the insulating member formed on a tip of the auxiliary ground conductor;
   wherein the elastically-deformed piece, in an elastically deformed status, comes in contact with the tip of the ground terminal protruding from the lower surface, when the auxiliary ground conductor is positioned facing the lower surface.

2. A motherboard comprising the cable assembly of claim 1.

3. A semiconductor tester comprising the cable assembly of claim 1.

4. A connector, the connector comprising:
   a main body, on which an insertion hole into which a tip of a cable member is inserted, the cable member being included in a co-axial cable;
   an insulating member, the insulating member being provided on a tip of the cable member, and including a upper surface and a lower surface, the upper and lower surfaces facing mutually opposite directions along the direction in which the tip of the cable member is inserted;
   a signal terminal, the signal terminal being electrically connected to a signal conductor of the cable member, extending in the direction in which the tip of the cable member is inserted, and being provided on the upper surface;
   a ground terminal, the ground terminal being electrically connected to a ground conductor of the co-axial cable, extending in the direction in which the tip of the cable member is inserted, being provided in a parallel manner with the signal terminal on the upper surface—the tip of which is bent on the upper surface side toward the lower surface; and
   an auxiliary ground conductor, the auxiliary ground connector extending in the direction in which the tip of the cable member is inserted, being provided in a manner so as to face the lower surface, and including an elastically-deformed piece bent on the insulating member formed on a tip of the auxiliary ground conductor;
   wherein the elastically-deformed piece, in an elastically deformed status, comes in contact with the tip of the ground terminal protruding from the lower surface, when the auxiliary ground conductor is positioned facing the lower surface.

5. The connector of claim 4, wherein the lower surface includes a primary surface in contact with the auxiliary ground conductor and a bottom concave from the primary surface, and the tip of the ground terminal protrudes from the bottom so as not to extend any further than the primary surface.

6. The connector of claim 5, wherein an insertion hole for the tip of the ground terminal to be inserted is formed on the insulating member, and the tip of the ground terminal passes through the insertion hole and protrudes from the lower surface.

7. The connector of claim 6, wherein the main body includes a convex member on the inside of the insertion hole, and the base of the auxiliary ground conductor rather than the tip thereof is positioned between the convex member and the insulating member.

8. The connector of claim 7, wherein the tip of the auxiliary ground conductor includes a disengagement-preventing piece bent in the opposite direction from the elastically-deformed piece.

9. The connector of claim 8, wherein the auxiliary ground conductor includes an arm in contact with the ground conductor of the co-axial cable on the base thereof rather than the tip thereof.

10. The connector of claim 4, wherein an insertion hole for the tip of the ground terminal is formed on the insulating member, and the tip of the ground terminal passes through the insertion hole and protrudes from the lower surface.

11. The connector of claim 10, wherein the main body includes a convex member on the inside of the insertion hole, and the base of the auxiliary ground conductor rather than the tip thereof is positioned between the convex member and the insulating member.

12. The connector of claim 11, wherein the tip of the auxiliary ground conductor includes a disengagement-preventing piece bent in the opposite direction from the elastically-deformed piece.

13. The connector of claim 4, wherein the main body includes a convex member on the inside of the insertion hole, and the base of the auxiliary ground conductor rather than the tip thereof is positioned between the convex member and the insulating member.

14. The connector of claim 13, wherein the tip of the auxiliary ground conductor includes a disengagement-preventing piece bent in the opposite direction from the elastically-deformed piece.

15. The connector of claim 4, wherein the auxiliary ground conductor includes an arm in contact with the ground conductor of the co-axial cable on the base thereof rather than the tip thereof.

16. The connector of claim 5, wherein the main body includes a convex member on the inside of the insertion hole, and the base of the auxiliary ground conductor rather than the tip thereof is positioned between the convex member and the insulating member.

17. The connector of claim 16, wherein the tip of the auxiliary ground conductor includes a disengagement-preventing piece bent in the opposite direction from the elastically-deformed piece.

18. The connector of claim 5, wherein the auxiliary ground conductor includes an arm in contact with the ground conductor of the co-axial cable on the base thereof rather than the tip thereof.

19. The connector of claim 6, wherein the auxiliary ground conductor includes an arm in contact with the ground conductor of the co-axial cable on the base thereof rather than the tip thereof.

20. The connector of claim 8, wherein the auxiliary ground conductor includes an arm in contact with the ground conductor of the co-axial cable on the base thereof rather than the tip thereof.

* * * * *